(12) United States Patent
Wang et al.

(10) Patent No.: US 12,433,028 B2
(45) Date of Patent: Sep. 30, 2025

(54) ARRAY SUBSTRATE AND MANUFACTURING METHOD FOR THE SAME, DISPLAY PANEL

(71) Applicant: BOE TECHNOLOGY GROUP CO., LTD., Beijing (CN)

(72) Inventors: Lizhong Wang, Beijing (CN); Ce Ning, Beijing (CN); Yunping Di, Beijing (CN); Binbin Tong, Beijing (CN); Rui Huang, Beijing (CN); Tianmin Zhou, Beijing (CN); Wei Yang, Beijing (CN); Liping Lei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 151 days.

(21) Appl. No.: 18/021,090

(22) PCT Filed: Mar. 4, 2022

(86) PCT No.: PCT/CN2022/079200
§ 371 (c)(1),
(2) Date: Feb. 13, 2023

(87) PCT Pub. No.: WO2022/267532
PCT Pub. Date: Dec. 29, 2022

(65) Prior Publication Data
US 2023/0317740 A1   Oct. 5, 2023

(30) Foreign Application Priority Data
Jun. 25, 2021   (CN) .......... 202110714844.2

(51) Int. Cl.
*H10D 86/60*   (2025.01)
*G02F 1/1362*   (2006.01)
*G02F 1/1368*   (2006.01)
*H10D 86/01*   (2025.01)
*H10D 86/40*   (2025.01)

(52) U.S. Cl.
CPC ....... *H10D 86/60* (2025.01); *G02F 1/136209* (2013.01); *G02F 1/136286* (2013.01);
(Continued)

(58) Field of Classification Search
CPC .... G02F 2001/13685; H01L 21/02565; H10D 86/471; H10D 86/021; H10D 86/421; H10D 86/40; H10D 86/431
See application file for complete search history.

(56) References Cited

U.S. PATENT DOCUMENTS

2008/0149937 A1* 6/2008 Moriwaki .............. H10D 86/60
                                                             257/773
2015/0221674 A1   8/2015 Cheng
(Continued)

FOREIGN PATENT DOCUMENTS

CN    202423298 U    9/2012
CN    103021939 A    4/2013
(Continued)

OTHER PUBLICATIONS

Office Action dated Dec. 18, 2024, issued in counterpart Application No. 202110714844.2, with English translation. (29 pages).

*Primary Examiner* — Jonathan Y Jung
(74) *Attorney, Agent, or Firm* — WHDA, LLP

(57) ABSTRACT

The present application provides an array substrate, a manufacturing method for the same, and a display panel. The array substrate includes a display area and a non-display area connected to the display area, and the display area includes a plurality of sub-pixels arranged in an array. The non-display area includes at least one polysilicon transistor, each of the sub-pixels includes an oxide transistor and a pixel electrode. A gate of the oxide transistor as well as a first electrode and a second electrode of the polysilicon transistor are arranged in a same layer; an active layer of the oxide transistor and the pixel electrode are arranged in a same (Continued)

layer, and are in contact with each other. The active layer of the oxide transistor includes an oxide semiconductor material, and the pixel electrode includes an oxide conductor material.

14 Claims, 5 Drawing Sheets

(52) U.S. Cl.
CPC ....... *G02F 1/1368* (2013.01); *H10D 86/0221* (2025.01); *H10D 86/423* (2025.01); *H10D 86/441* (2025.01); *H10D 86/471* (2025.01)

(56) References Cited

U.S. PATENT DOCUMENTS

| | | | | |
|---|---|---|---|---|
| 2015/0303222 A1* | 10/2015 | Ning | ................ | H10D 99/00 |
| | | | | 257/43 |
| 2017/0104102 A1* | 4/2017 | Liu | ................ | H10D 86/481 |
| 2018/0308958 A1 | 10/2018 | Shu et al. | | |
| 2019/0243194 A1* | 8/2019 | Okada | ................ | H10K 50/00 |
| 2021/0327911 A1* | 10/2021 | Hara | ................ | H10D 86/423 |
| 2021/0384276 A1* | 12/2021 | Imai | ................ | G09G 3/3233 |
| 2021/0391358 A1* | 12/2021 | Wang | ................ | H10D 86/423 |
| 2022/0093801 A1* | 3/2022 | Cho | ................ | H10D 30/6713 |

FOREIGN PATENT DOCUMENTS

| | | |
|---|---|---|
| CN | 103456742 A | 12/2013 |
| CN | 106847834 A | 6/2017 |
| CN | 207009438 U | 2/2018 |
| CN | 109004032 A | 12/2018 |
| CN | 105655291 B | 3/2019 |
| CN | 110190072 A | 8/2019 |
| CN | 112259610 A | 1/2021 |
| CN | 113314547 A | 8/2021 |
| CN | 215988758 U | 3/2022 |

\* cited by examiner

ARRAY SUBSTRATE AND MANUFACTURING METHOD FOR THE SAME, DISPLAY PANEL

CROSS-REFERENCE TO RELATED APPLICATIONS

The present application claims the priority of the Chinese patent application No. 202110714844.2, entitled "ARRAY SUBSTRATE AND MANUFACTURING METHOD FOR THE SAME, DISPLAY PANEL" and submitted to the CNIPA, China National Intellectual Property Administration, on Jun. 25, 2021, the contents of which are incorporated herein by reference in its entirety.

TECHNICAL FIELD

The present application relates to the field of display technology, in particular to an array substrate, a manufacturing method for the same, and a display panel.

BACKGROUND

Low temperature polysilicon (LTPS) technology has high mobility and is easy to achieve narrow borders, while oxide technology has the characteristics of low leakage (that is, small Ioff), and can solve the leakage problem and achieve low power consumption. Thus, the low temperature polycrystalline oxide (LTPO) technology as a combination of the two has become the focus of industry research. However. LTPO has complex film layers and involves two different process routes, thus a conventional LTPO substrate has more than 15 mask processes, which brought great challenges to product cost and yield.

SUMMARY

Embodiments of the present application provide an array substrate, a manufacturing method for the same, and a display panel.

In view of the above, the embodiments of the present application adopt the following technical solutions.

One aspect provides an array substrate, including: a display area and a non-display area connected to the display area; the display area includes a plurality of sub-pixels arranged in an array; and the non-display area includes at least one polysilicon transistor; each of the sub-pixels includes an oxide transistor and a pixel electrode; a gate of the oxide transistor, a first electrode and a second electrode of the polysilicon transistor are arranged in a same layer; an active layer of the oxide transistor and the pixel electrode are arranged in a same layer, and are in contact with each other; the active layer of the oxide transistor includes an oxide semiconductor material, and the pixel electrode includes an oxide conductor material.

Optionally, the array substrate further includes a base, the polysilicon transistor and the sub-pixel are arranged on a same side of the base. The polysilicon transistor is a top-gate polysilicon transistor, the gate of the oxide transistor is arranged on a side of the active layer of the oxide transistor facing away from the base, and an orthographic projection of the gate of the oxide transistor on the base at least partially overlaps with an orthographic projection of the active layer of the oxide transistor on the base.

Optionally, the orthographic projection of the gate of the oxide transistor on the base is within the orthographic projection of the active layer of the oxide transistor on the base.

Optionally, the array substrate further includes a gate insulation layer disposed between the active layer of the oxide transistor and the gate of the oxide transistor, and the gate insulation layer is an oxygen-enriched oxide layer.

Optionally, the oxide transistor further includes a connection electrode. The connection electrode is disposed on a side of the gate of the oxide transistor facing away from the base, and is electrically connected to the active layer of the oxide transistor.

Optionally, the sub-pixel further includes a light shielding portion. The light shielding portion is disposed on a side of the active layer of the oxide transistor close to the base, and the orthographic projection of the active layer of the oxide transistor on the base is within an orthographic projection of the light shielding portion on the base, and an orthographic projection of the pixel electrode on the base partially overlaps with the orthographic projection of the light shielding portion on the base.

Optionally, a gate of the polysilicon transistor and the light shielding portion are arranged in a same layer.

Optionally, the sub-pixel further includes an opening area and a non-opening area connected to the opening area. The oxide transistor is disposed in the non-opening area, the pixel electrode includes a first sub-electrode and a second sub-electrode, and two sides of the first sub-electrode are in contact with the second sub-electrode and the active layer of the oxide transistor respectively, the first sub-electrode is disposed in the non-opening area, and the second sub-electrode is disposed in the opening area.

Optionally, the opening area of the sub-pixel further includes a first passivation portion and a common electrode. The first passivation portion covers the second sub-electrode, and the common electrode is disposed on a side of the first passivation portion facing away from the second sub-electrode.

Optionally, the pixel electrode is a planar electrode, and the common electrode comprises at least one strip-shaped sub-electrode.

Optionally, the array substrate further includes a second passivation portion. The second passivation portion covers the polysilicon transistor and the oxide transistor.

Optionally, the array substrate further includes a base and a flat portion, the flat portion is arranged on a side of the second passivation portion close to the base, and an orthographic projection of the flat portion on the base does not overlap with an orthographic projection of the first passivation portion on the base.

Optionally, the display area further includes a base, and a plurality of gate lines and a plurality of data lines disposed on the base. A part of the gate line that overlaps with the active layer of the oxide transistor along a direction perpendicular to the base is the gate of the oxide transistor; the gate lines as well the first electrode and the second electrode of the polysilicon transistor are arranged in a same layer. A part of the data line that overlaps with the active layer of the oxide transistor along the direction perpendicular to the base is a connection electrode of the oxide transistor.

Another aspect provides a display panel including the above array substrate.

Another aspect provides a method for manufacturing an array substrate, including:

forming at least one polysilicon transistor and a plurality of sub-pixels arranged in an array, where the polysilicon transistor is disposed in a non-display area of the array substrate, and the sub-pixel is disposed in a display area of the array substrate and includes an oxide transistor and a pixel electrode;

the forming at least one polysilicon transistor and a plurality of sub-pixels includes:

forming the active layer of the oxide transistor and the pixel electrode through one patterning process, where the active layer of the oxide transistor is in contact with the pixel electrode, the active layer of the oxide transistor includes an oxide semiconductor material, the pixel electrode includes an oxide conductor material; and forming the gate of the oxide transistor as well as the first electrode and the second electrode of the polysilicon transistor through one patterning process.

Optionally, the forming the active layer of the oxide transistor and the pixel electrode through one patterning process includes:

forming an oxide semiconductor layer through one patterning process; and performing conductive treatment on a portion to be conductive in the oxide semiconductor layer, to form the active layer of the oxide transistor and the pixel electrode.

The above description is only a summary of solutions of the present disclosure. In order to learn technical means of the present disclosure more clearly and allow the technical means to be implemented based on the disclosure of the description, and in order to make the above and other objects, features and advantages of the present disclosure more obvious and understandable, specific embodiments of the present disclosure are illustrated below.

BRIEF DESCRIPTION OF THE DRAWINGS

In order to clearly explain technical solutions of embodiments of the present disclosure, drawings required in the description of the embodiments or the related art are briefly introduced below. Apparently, the drawings in the following description are only some embodiments of the present disclosure. For those skilled in the art, other drawings can be obtained based on these drawings without paying creative work.

DETAILED DESCRIPTION OF THE EMBODIMENTS

Figure 1:
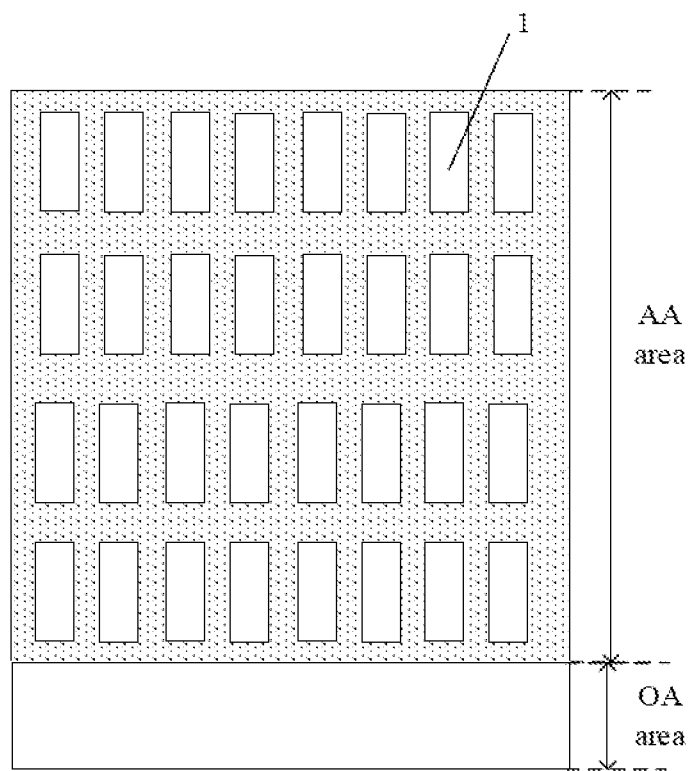
FIG. 1 is a schematic structural diagram of an array substrate provided by embodiments of the present application.

The technical solutions of the embodiments of the present application will be described below with reference to the accompanying drawings of the embodiments of the present application. Apparently, only a part of the embodiments, not all the embodiments of the present application, are described. All other embodiments obtained, based on the embodiments described in the present application, by those skilled in the art without paying creative efforts shall fall within the protection scope of the present application.

In the embodiments of the present application, wordings such as "first", "second", and "third" are used to distinguish the same or similar items with basically the same functions and effects, only used for clearly describing solutions of the embodiments of the present application, and should not be understood as indicating or implying the relative importance or implying the number of indicated technical features.

In the embodiments of the present application. "multiple" means two or more, and "at least one" means one or more, unless otherwise specifically defined.

In the embodiments of the present application, orientations or positional relationships indicated by terms such as "upper", "lower" are based on the orientations or positional relationships shown in the drawings, and are only for the convenience of describing the application and simplifying the description, rather than indicating or implying that a referenced device or element must have a particular orientation, be constructed and operated in a particular orientation, and can not be construed as limiting the application.

An embodiment of the present application provides an array substrate. Referring to FIG. 1, the array substrate includes a display area (Area 'AA' shown in FIG. 1) and a non-display area (Area 'OA' shown in FIG. 1) connected to the display area. The display area includes a plurality of sub-pixels 1 arranged in an array.

Figure 2:
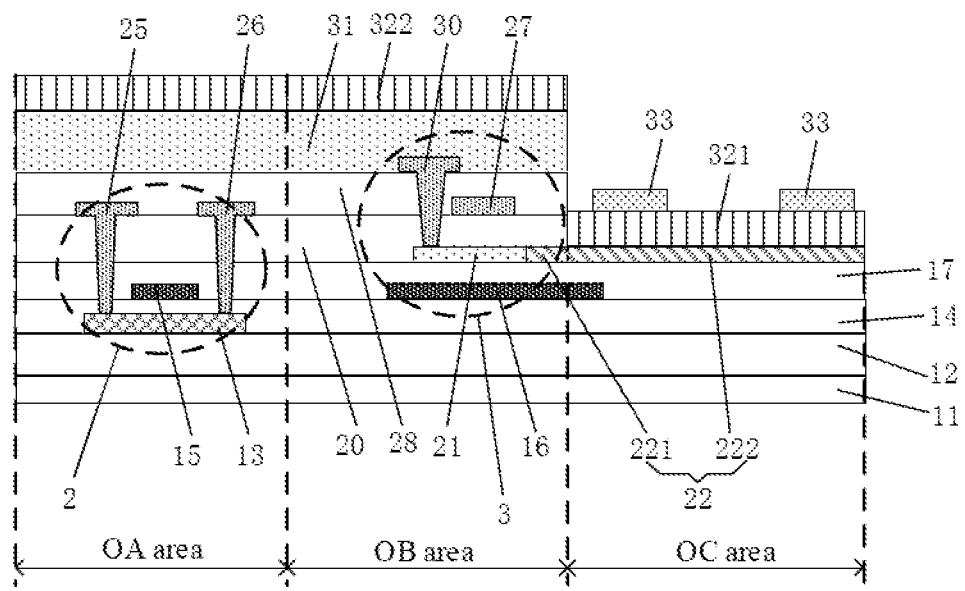
FIG. 2 is a schematic structural diagram of another array substrate provided by embodiments of the present application.

Referring to FIG. 2, the non-display area includes at least one polysilicon transistor 2, the sub-pixel includes an oxide transistor 3 and a pixel electrode 22.

As shown in FIG. 2, a gate 27 of the oxide transistor 3 as well as a first electrode 25 and a second electrode 26 of the polysilicon transistor 2 are provided in the same layer, an active layer 21 of the oxide transistor 3 and the pixel electrode 22 are provided in the same layer and in contact with each other. The active layer 21 of the oxide transistor 3 includes an oxide semiconductor material, and the pixel electrode 22 includes an oxide conductor material.

The display area refers to an area for realizing display, and the non-display area is generally used for providing a drive circuit such as a gate driver on array (GOA) drive circuit and the like. The specific positional relationship between the non-display area and the display area is not limited. For example, as shown in FIG. 1 the non-display area may be provided on a side of the display area and connected to the side of the display area. Alternatively, the non-display area may also be provided around the display area and connected to peripheral sides of the display area. Of course, other providing manners are also possible, which will not be listed one by one here, and the details can be determined according to actual requirements.

The polysilicon transistor may be applied in the GOA drive circuit or other drive circuits, which is not limited here. In addition, the type of the polysilicon transistor is not limited, and it may be a top-gate polysilicon transistor, or may also be a bottom-gate polysilicon transistor. In FIG. 2, a top-gate polysilicon transistor is taken as an example for illustration. The polysilicon transistor may include a gate, a source and a drain. One of the source and the drain is called as a first electrode, and the other is called as a second electrode. Transistors can be classified into two types according to the positional relationship of electrodes. One type of transistor is called as a bottom-gate thin film transistor in which the gate is located below the source and drain, and the other type of transistor is called as a top-gate thin film transistor in which the gate is located above the source and drain.

The material of the active layer of the oxide transistor may be a metal oxide such as indium gallium zinc oxide (IGZO) or indium tin zinc oxide (ITZO).

The above "providing in the same layer" refers to being manufactured by one patterning process. One patterning process refers to a process of forming a required layer structure through one exposure. One patterning process includes processes such as masking, exposure, development, etching and stripping.

The active layer of the oxide transistor includes an oxide semiconductor material, and the pixel electrode includes an oxide conductor material. The oxide conductor material can be formed by performing a conductive treatment on the oxide semiconductor material. For example, a plasma process can be used to treat the oxide semiconductor material.

In the related art, an oxide transistor includes a gate, a source, and a drain, the drain is electrically connected to the pixel electrode, and the source is electrically connected to the data line. Under the control of the oxide transistor, the data signal of the data line is transmitted to the pixel electrode.

In the present application, the active layer of the oxide transistor and the pixel electrode are provided in the same layer and are in contact with each other, so that the drain can be omitted. On the one hand, the mask processes can be reduced, and the complexity of the manufacturing process can be reduced. On the other hand, in the related art, the drain is generally made of opaque metal, thereby reducing the transmittance and aperture ratio. On the contrary, in the present application, there is no need to additionally provide a drain, meanwhile, the pixel electrode includes an oxide conductor material, and the oxide conductor material has a high transmittance, thereby greatly increasing the transmittance and aperture ratio. In addition, in the present application, the gate of the oxide transistor as well as the first electrode and the second electrode of the polysilicon transistor are arranged in the same layer, which can further reduce the mask processes and simplify the complexity of the process. The array substrate provided by the present application has the characteristics of high aperture ratio, simple manufacturing process and low production cost.

Optionally, the array substrate further includes a base, and the polysilicon transistor and the sub-pixels are arranged on the same side of the base.

Figure 13:
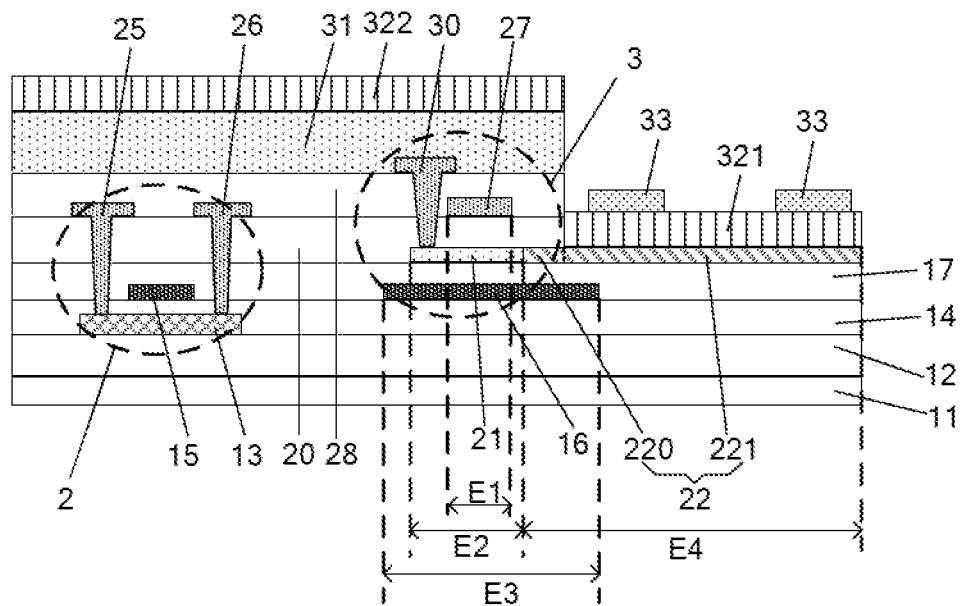

To further simplify the structure, as shown in FIG. 2, the polysilicon transistor 2 is a top-gate polysilicon transistor, and the gate 27 of the oxide transistor 3 is arranged on a side of the active layer 21 of the oxide transistor 3 facing away from the base 11. As shown in FIG. 13, an orthographic projection E1 of the gate 27 of the oxide transistor 3 on the base 11 at least partially overlaps with an orthographic projection E2 of the active layer 21 of the oxide transistor 3 on the base 11.

The orthographic projection of the gate of the oxide transistor on the base at least partially overlaps with the orthographic projection of the active layer of the oxide transistor on the base as follows: the orthographic projection of the gate of the oxide transistor on the base partially overlaps with the orthographic projection of the active layer of the oxide transistor on the base, in this case, the gate of the oxide transistor overlaps with the active layer of the oxide transistor along a direction perpendicular to the base. Alternatively, the orthographic projection of the gate of the oxide transistor on the base is within the orthographic projection of the active layer of the oxide transistor on the base, in this case, the gate of the oxide transistor and the active layer of the oxide transistor completely overlap along the direction perpendicular to the base. The latter is illustrated in FIG. 13 as an example.

Optionally, in order to increase the channel length to improve the performance of the oxide transistor, as shown in FIG. 13, the orthographic projection E1 of the gate 27 of the oxide transistor 3 on the base 11 is within the orthographic projection E2 of the active layer 21 of the oxide transistor 3 on the base 11.

Optionally, in order to protect the active layer, as shown in FIG. 2, the array substrate further includes a gate insulation layer 20 disposed between the active layer 21 of the oxide transistor 3 and the gate 27 of the oxide transistor 3, and the gate insulation layer is an oxygen-enriched oxide layer.

The material and thickness of the gate insulation layer are not limited, for example, the gate insulation layer can be made from silicon dioxide, and the thickness is in a range of 1000~2000 Å.

The pixel electrode can be formed by performing conductive treatment on the oxide semiconductor material. In the manufacturing process of the array substrate, the oxide semiconductor material can be formed first at a position where the pixel electrode is located, and then the gate insulation layer can be formed, meanwhile, reducing gas such as hydrogen is used to complete a plasma treatment to make the oxide semiconductor material conductive, thereby forming the pixel electrode. To avoid the conductive of the active layer of the oxide transistor, an oxygen-enriched oxide layer can be used to neutralize excess H (hydrogen).

Optionally, referring to FIG. 2, the oxide transistor 3 further includes a connection electrode 30. The connection electrode 30 is arranged on a side of the gate 27 of the oxide transistor 3 facing away from the base 11, and is electrically connected to the active layer 21 of the oxide transistor 3.

In the related art, an oxide transistor generally includes three electrodes, that is, a gate, a source, and a drain. On the contrary, in the present application, the oxide transistor includes two electrodes, that is, a gate and a connection electrode, thus the structure is simpler, thereby reducing the process complexity.

When the array substrate is applied to a liquid crystal display panel, the light emitted by the backlight module will irradiate the active layer of the oxide transistor. Since the active layer of the oxide transistor is easily affected by the light, the characteristics of the transistor are reduced. In order to prevent the light from affecting the active layer, optionally, as shown in FIG. 2, the sub-pixel further includes a light shielding portion 16. The light shielding portion 16 is disposed on a side of the active layer 21 of the oxide transistor 3 close to the base 11. Further, referring to FIG. 13, the orthographic projection E2 of the active layer 21 of the oxide transistor 3 on the base 11 is within the orthographic projection E3 of the light shielding portion 16 on the base 11, and the orthographic projection E4 of the pixel electrode 22 on the base 11 partially overlaps with the orthographic projection E3 of the light shielding portion 16 on the base 11.

The material of the light shielding portion can be selected from opaque metals, such as copper, aluminum, silver, and the like.

The light shielding portion can block the light incident on the active layer, thereby preventing the active layer from being affected by the light, thereby improving the characteristics of the transistor.

Further, optionally, in order to further simplify the process and reduce the number of mask processes, the gate of the polysilicon transistor and the light shielding portion are arranged in the same layer, that is, the gate of the polysilicon transistor and the light shielding portion can be formed through one patterning process.

In one or more embodiments, as shown in FIG. 2, the sub-pixel further includes an opening area (OC area) and a non-opening area (OB area) connected to the opening area.

Referring to FIG. 2, the oxide transistor 3 is disposed in the non-opening area (OB area). The pixel electrode 22 includes a first sub-electrode 221 and a second sub-electrode 222, and two sides of the first sub-electrode 221 are in contact with the second sub-electrode 222 and the active layer 21 of the oxide transistor 3 respectively. The first sub-electrode 221 is disposed in the non-opening area (OB area), and the second sub-electrode 222 is disposed in the opening area (OC area).

The pixel electrode can be formed by performing plasma treatment on the oxide semiconductor material. During the plasma treatment process, due to ion diffusion, part of the oxide semiconductor material under the gate insulation layer is also conductive, thereby forming the first sub-electrode. Compared with a substrate that is provided with the pixel electrodes merely in the opening area, in the present application, the pixel electrodes have a larger area, so that a larger overlapping area can be formed with the common electrode, thereby improving the driving effect of capacitance and liquid crystal molecules. In addition, the oxide transistor includes two electrodes, that is, the gate and the connection electrode, without providing a third electrode. Therefore, under the condition that the area occupied by the original sub-pixel remains unchanged, the area of the non-opening area can be reduced and the area of the opening area can be increased, thereby increasing the aperture ratio.

Optionally, as shown in FIG. 2, the opening area (OC area) of the sub-pixel further includes a first passivation portion 321 and a common electrode. The first passivation portion 321 is configured to cover the second sub-electrode 222, and the common electrode is disposed on a side of the first passivation portion 321 facing away from the second sub-electrode 222.

The common electrode may include at least one strip-shaped sub-electrode. FIG. 2 shows an example where the common electrode includes two strip-shaped sub-electrodes 33.

In the present application, the pixel capacitance can be controlled by controlling the thickness of the first passivation portion, and the thickness of the first passivation portion is not limited, for example, the thickness of the first passivation portion may be in a range of 500~3000 Å.

The number of layers of the first passivation portion is not limited here. For example, the first passivation portion may only include a one-layer structure, for example a silicon dioxide layer or a silicon nitride layer. Alternatively, the first passivation portion may also include a multilayer stacked structure, for example a two-layer stacked structure including a silicon dioxide layer and a silicon nitride layer. FIG. 2 shows an example in which the first passivation portion includes a one-layer structure.

When the array substrate is applied in a liquid crystal display panel, an electric field can be formed between the common electrode and the pixel electrode to drive the deflection of liquid crystal molecules.

Optionally, in order to increase the electric field strength between the pixel electrode and the common electrode, the pixel electrode is a planar electrode, and the common electrode includes at least one strip-shaped sub-electrode.

The number of strip-shaped sub-electrodes is not limited here, which can be selected according to actual requirements.

Optionally, in order to better protect the polysilicon transistor and the oxide transistor, as shown in FIG. 2, the army substrate further includes a second passivation portion 322, and the second passivation portion 322 is configured to cover the polysilicon transistor 2 and the oxide transistor 3.

In order to simplify the process, the materials of the second passivation portion and the first passivation portion may be the same, and may be formed by one deposition.

Optionally, in order to obtain a planar surface to facilitate subsequent processes, as shown in FIG. 2, the array substrate further includes the base 11 and a flat portion 31. The flat portion 31 is disposed on a side of the second passivation portion 322 close to the base 11, and the orthographic projection of the flat portion 31 on the base 11 does not overlap with the orthographic projection of the first passivation portion 321 on the base 11.

The orthographic projection of the flat portion on the base does not overlap with the orthographic projection of the first passivation portion on the base, in other words, no flat portion is provided in the opening area. Compared with a substrate provided with a flat portion in the opening area, the transmittance can be improved by about 12%.

Figure 14:
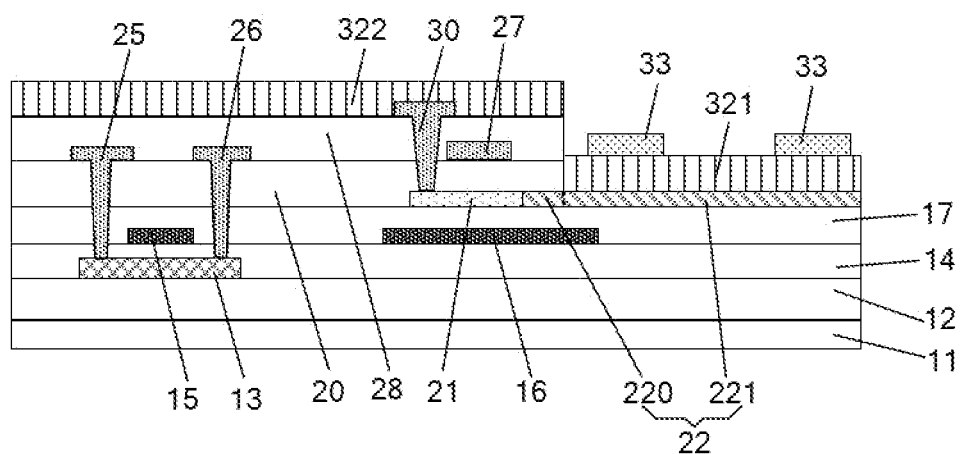
FIG. 14 is a schematic structural diagram of yet another array substrate provided by embodiments of the present application.

It should be noted that a mask process is required to form the above-mentioned flat portion. In order to further simplify the process, as shown in FIG. 14, no flat portion 31 is provided on the side of the second passivation portion 322 close to the base 11.

Figure 3:
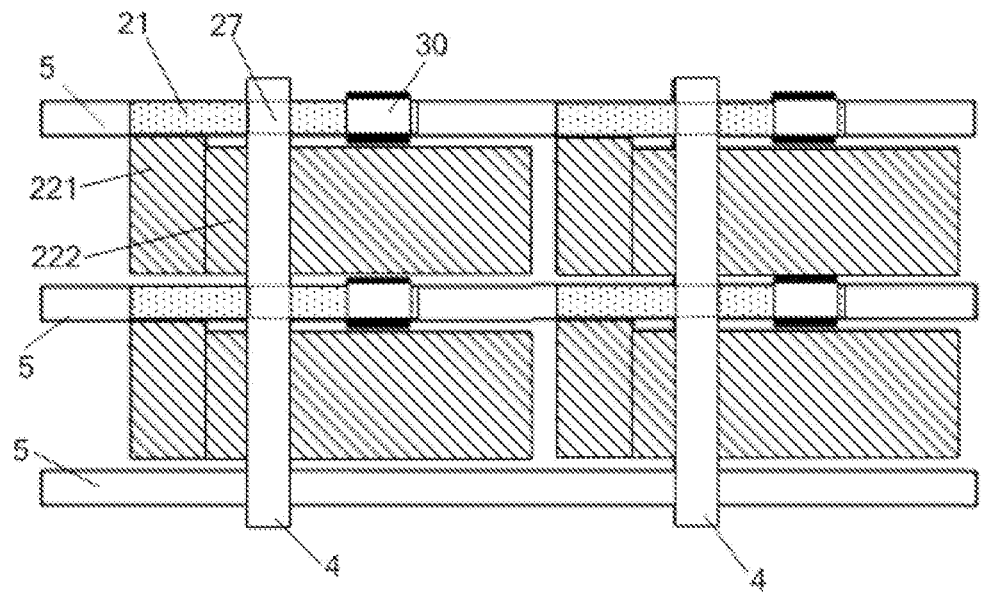
FIG. 3 is a schematic structural diagram of yet another array substrate provided by embodiments of the present application.

In one or more embodiments, referring to FIG. 3, the display area further includes a base (not shown in FIG. 3), and a plurality of gate lines 4 and a plurality of data lines 5 disposed on the base.

Referring to FIG. 3, a part of the gate line 4 that overlaps with the active layer 21 of the oxide transistor along the direction perpendicular to the base is the gate 27 of the oxide transistor, and the gate line as well as the first electrode and the second electrode of the polysilicon transistor are arranged in the same layer.

Referring to FIG. 3, a part of the data line 5 that overlaps with the active layer 21 of the oxide transistor along the direction perpendicular to the substrate is the connection electrode 30 of the oxide transistor.

Since the part of the gate line that overlaps with the active layer of the oxide transistor along the direction perpendicular to the base is used as the gate of the oxide transistor, there is no need to provide the gate separately. Therefore, the process is further simplified, the space is saved, which facilitates increasing the aperture ratio. Meanwhile, by providing the gate lines as well as the first electrode and the second electrode of the polysilicon transistor in the same layer, the number of mask processes can be reduced and the difficulty of the process is further reduced.

Since the part of the data line that overlaps with the active layer of the oxide transistor along the direction perpendicular to the base is used as the connection electrode of the oxide transistor, there is no need to provide the connection electrode separately. Therefore, the process is further simplified, the space is saved, which facilitates increasing the aperture ratio.

It should be noted that, referring to FIG. 2, the array substrate may further include structures such as a buffer layer 12, a first insulation layer 14, a first interlayer dielectric layer 17, a second interlayer dielectric layer 28. Only contents related to the idea of the present application are introduced here, other structures can refer to related technologies and will not be described in detail here.

Embodiments of the present application further provide a display panel including the above-mentioned array substrate. The display panel may be liquid crystal display panels of twisted nematic (TN) type, vertical alignment (VA) type, in-plane switching (IPS) type or advanced super dimension switch (ADS) type, as well as any products or components with display functions such as TVs, digital cameras, mobile phones, and tablet computers that include such display panels.

Further, the display panel may also include other structures such as a color filter substrate and a liquid crystal substrate. Here, only the content related to the idea of the present application is introduced, and other structures can be obtained by referring to related technologies, and will not be described in detail here.

Embodiments of the present application further provide a method for manufacturing an array substrate, including:

In S01, at least one polysilicon transistor and a plurality of sub-pixels arranged in an array are formed. The at least one polysilicon transistor is arranged in the non-display area of the array substrate. The sub-pixel is arranged in the display area of the array substrate, and includes an oxide transistor and a pixel electrode.

The polysilicon transistor and the sub-pixels are formed in S01 by the following steps:
  in S01, forming the active layer of the oxide transistor and the pixel electrode through one patterning process, where the active layer of the oxide transistor is in contact with the pixel electrode, the active layer of the oxide transistor includes an oxide semiconductor material, and the pixel electrode includes an oxide conductor material; and
  in S012, forming the gate of the oxide transistor as well as the first electrode and the second electrode of the polysilicon transistor through one patterning process.

The manufacturing method is simple and easy to implement. In the array substrate formed through the method, the active layer of the oxide transistor and the pixel electrode are provided in the same layer and are in contact with each other, so that the drain can be omitted. On the one hand, the mask processes can be reduced, and the complexity of the manufacturing process can be reduced. On the other hand, in the related art, the drain is generally made of opaque metal, thereby reducing the transmittance and aperture ratio. On the contrary, in the present application, there is no need to additionally provide a drain, meanwhile, the pixel electrode includes an oxide conductor material, and the oxide conductor material has a high transmittance, thereby greatly increasing the transmittance and aperture ratio. In addition, in the present application, the gate of the oxide transistor as well as the first electrode and the second electrode of the polysilicon transistor are arranged in the same layer, which can further reduce the mask processes and simplify the complexity of the process. The array substrate provided by the present application has the characteristics of high aperture ratio, simple manufacturing process and low production cost.

Further, optionally, the forming, in S011, the active layer of the oxide transistor and the pixel electrode through one patterning process includes:
  in S0111, forming an oxide semiconductor layer through one patterning process; and
  in S0112, performing conductive treatment on a portion to be conductive in the oxide semiconductor layer, to form the active layer of the oxide transistor and the pixel electrode.

The specific process of the conductive treatment is not limited here. Exemplarily, the plasma treatment is performed using a reducing gas (for example, hydrogen gas), so that the portion of the oxide semiconductor needs to be conductive is conductive.

By performing S0111 and S0112, the active layer of the oxide transistor and the pixel electrode can be formed. This method is simple, easy to implement, and highly operable.

A specific manufacturing method of the array substrate is described below by taking the array substrate shown in FIG. 13 as an example. The method includes steps described below.

Figure 4:
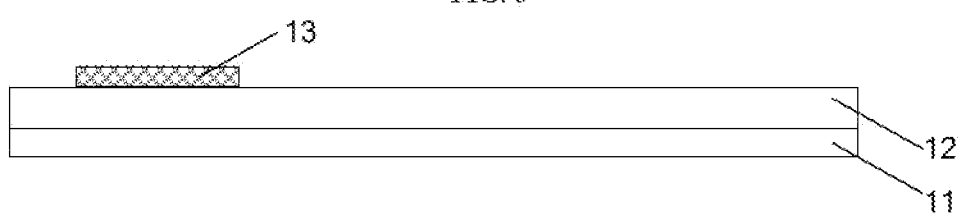
FIGS. 4-13 are structural diagrams illustrating a flow of manufacturing a structure as shown in FIG. 13 provided by embodiments of the present application.

In S101, referring to FIG. 4, a buffer layer 12 and an active layer 13 of a polysilicon transistor are sequentially formed on a base 11.

The aforementioned base may be a rigid base, for example a glass base. The material of the active layer of the polysilicon transistor may be a low temperature polysilicon material. The material of the buffer layer may be silicon oxide or silicon nitride.

The specific method of forming the active layer is not limited. For example, an amorphous silicon layer (a-Si) can be formed first, and then an excimer laser annealing process (ELA) is used to convert the amorphous silicon layer into a polysilicon layer. Next, the polysilicon layer is patterned to form the active layer 13 shown in FIG. 4.

One mask is required in S101 to form the active layer of the polysilicon transistor.

Figure 5:
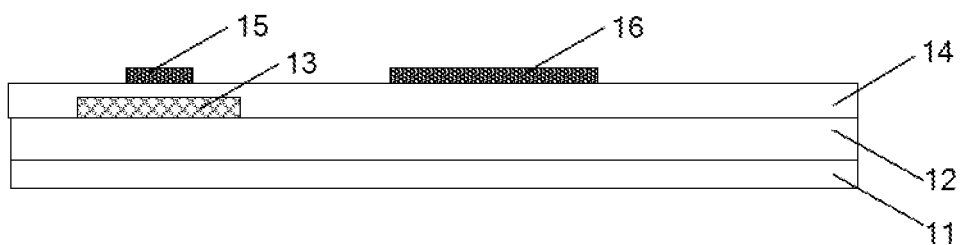

In S102, referring to FIG. 5, a first insulation layer 14, a gate 15 of the polysilicon transistor, and a light shielding portion 16 are formed on the active layer 13 of the polysilicon transistor.

One patterning process is used in S102 to form the gate 15 of the polysilicon transistor and the light shielding portion 16, and one mask is required.

Figure 6:
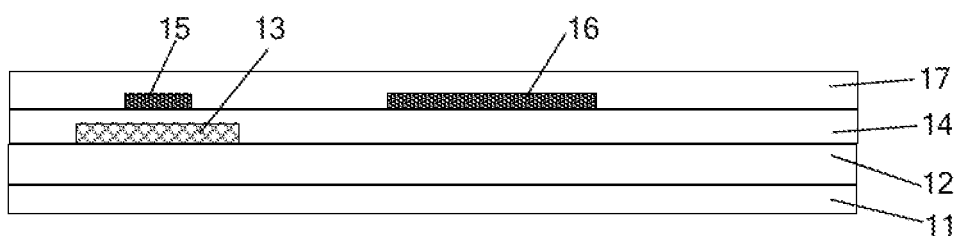

In S103, referring to FIG. 6, a first interlayer dielectric layer 17 is formed. The first interlayer dielectric layer covers the gate 15 of the polysilicon transistor and the light shielding portion 16.

The first interlayer dielectric layer may include a single-layer structure. Alternatively, the first interlayer dielectric layer may also include a multilayer stacked structure. For example, the first interlayer dielectric layer is a three-layer stacked structure including a first silicon oxide layer, a silicon nitride layer and a second silicon oxide layer. The first silicon oxide layer is closer to the base than the second silicon oxide layer. The thickness of the first silicon oxide layer is in a range of 1000~3000 Å, the thickness of the silicon nitride layer is in a range of 1000~3000 Å, and the thickness of the second silicon oxide layer is in a range of 2000~5000 Å. FIG. 6 shows an example in which the first interlayer dielectric layer includes a single-layer structure.

Figure 7:
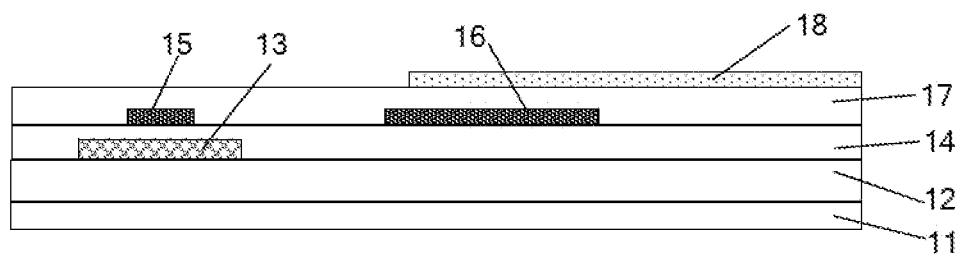

In S104, referring to FIG. 7, an oxide semiconductor layer 18 is formed on the first interlayer dielectric layer 17.

The material of the oxide semiconductor layer 18 may be IGZO, and the thickness thereof is in a range of 100~1500 Å. The oxide semiconductor layer may include a single-layer structure or a multilayer stacked structure. For example, the oxide semiconductor layer includes a first oxide semiconductor sublayer and a second oxide semiconductor sublayer. The first oxide semiconductor sublayer is closer to the base than the second oxide semiconductor sublayer, and the first oxide semiconductor sublayer is a dense layer. FIG. 7 shows an example in which the oxide semiconductor layer includes a single-layer structure.

One Mask is required in S104 to form the oxide semiconductor layer.

Figure 8:
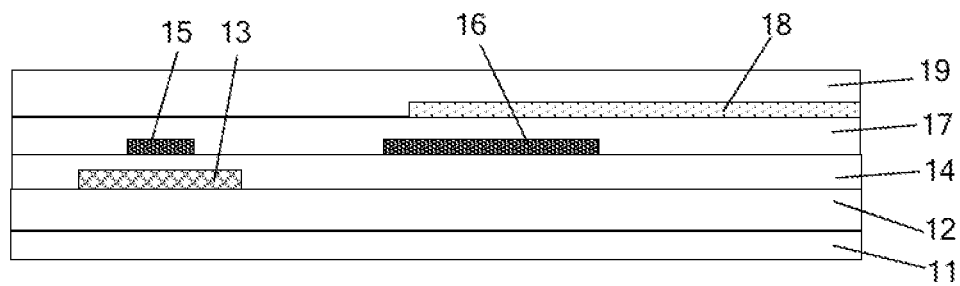

In S105, referring to FIG. 8, a gate insulation film 19 is deposited. The material of the gate insulation film is silicon dioxide, and the thickness thereof is in a range of 1000~2000 Å.

Figure 9:
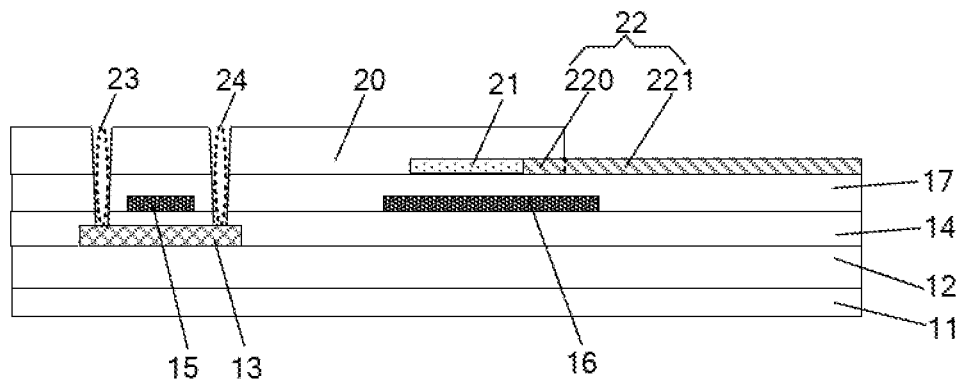

In S106, an etching process is performed on the gate insulation film 19 shown in FIG. 8 to form the gate insulation layer 20 and the pixel electrode 22 shown in FIG. 9. The pixel electrode 22 includes a first sub-electrode 221 and a second sub-electrode 222.

In the above etching process, a part of the oxide semiconductor layer 18 can be made conductive, and due to particle diffusion, a part of the oxide semiconductor layer under the gate insulation layer 20 is also made conductive, thereby forming the first sub-electrode 221. Meanwhile, after the etching process, a first via hole 23 and a second via hole 24 as shown in FIG. 9 are also formed.

One Mask is required in S106 to form the gate insulation layer, one mask is required to form the first via hole and the second via hole, and thus there are 2 Masks in total.

Figure 10:
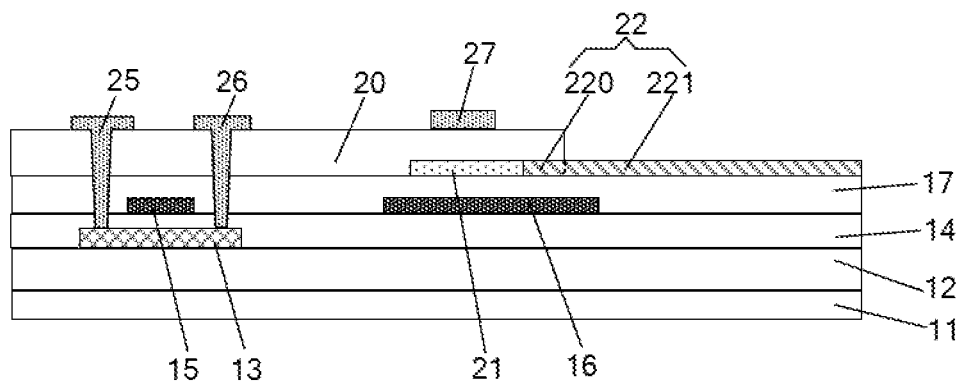

In S107, referring to FIG. 10, the gate 27 of the oxide transistor 3 as well as the first electrode 25 and the second electrode 26 of the polysilicon transistor 2 are formed.

The gate of the oxide transistor as well as the first and second electrodes of the polysilicon transistor are formed through one patterning process in S107, and one mask is required.

Figure 11:
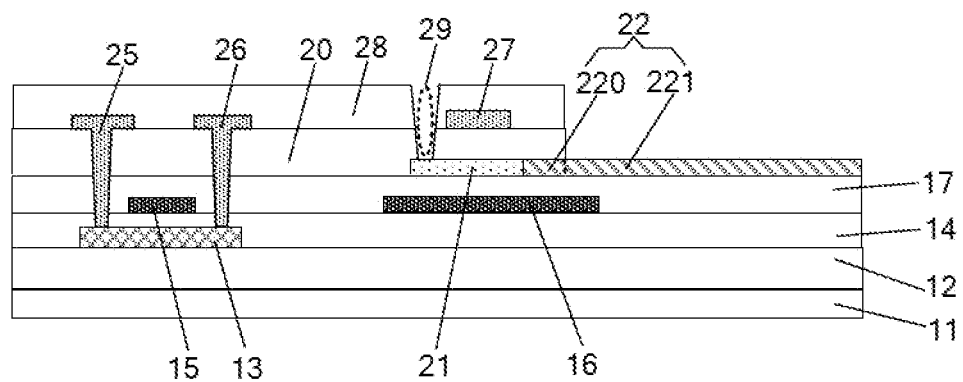

In S108, a second interlayer dielectric layer 28 as shown in FIG. 11 is formed.

The second interlayer dielectric layer may include a single-layer structure or a multilayer stacked structure. Exemplarily, the second interlayer dielectric layer includes a two-layer stacked structure of a silicon oxide layer and a silicon nitride layer. FIG. 11 shows an example in which the second interlayer dielectric layer includes a single-layer structure. The thickness of the second interlayer dielectric layer is in a range of 3000~5000 Å.

In S108, a third via hole 29 is also formed while forming the second interlayer dielectric layer 28. One Mask is required in S108 to form the second interlayer dielectric layer.

Figure 12:
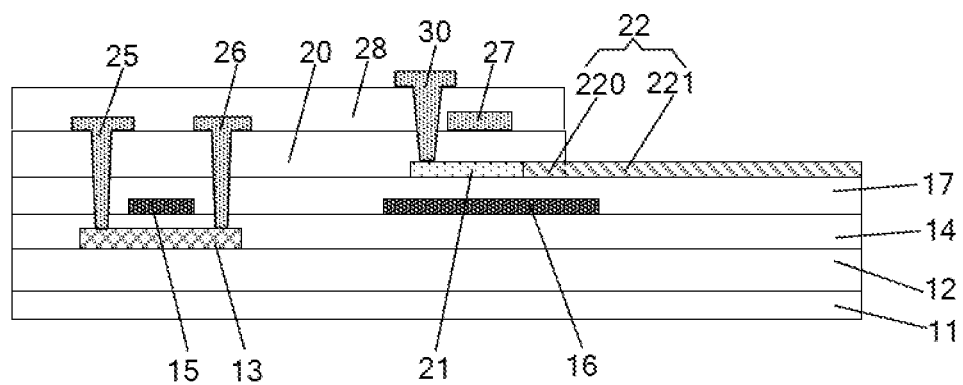

In S109, a connection electrode 30 of the oxide transistor as shown in FIG. 12 is formed. One Mask is required in this step.

In S110, a flat portion 31, a first passivation portion 321, a second passivation portion 322 and a common electrode as shown in FIG. 13 are formed, and the common electrode includes two strip-shaped sub-electrodes 33.

In the present application, the pixel capacitance can be controlled by controlling the thickness of the first passivation portion, the thickness of the first passivation part is not limited, for example, the thickness of the first passivation portion may be in a range of 500~3000 Å.

The first passivation portion may only include a one-layer structure, such as a silicon dioxide layer or a silicon nitride layer; or may also include a multi-layer stacked structure, such as a two-layer stack structure of a silicon dioxide layer and a silicon nitride layer. FIG. 2 shows an example in which the first passivation portion includes a one-layer structure.

In S110, one mask is required to form the flat portion, and one mask is required to form the common electrode, and thus there are two masks in total.

In the above manufacturing method, 1 mask is used in S101, 1 mask is used in S102, 1 mask is used in S104, 2 masks are used in S106, 1 mask is used in S107, 1 mask is used in S108, 1 mask is used in S109, and 2 masks are used in S110, there are 10 Masks in total. Compared with the related art that uses more than 15 masks to form the array substrate, the process complexity and production cost of the manufacturing method are greatly reduced, and the aperture ratio and transmittance of the array substrate formed are both improved.

It should be noted that, for the description of relevant structure in the array substrate involved in the embodiments of the present application, reference may be made to the above embodiments, and details are not repeated here.

Terms such as "one embodiment". "an embodiment", or "one or more embodiments" used herein means that a particular feature, structure, or characteristic described in connection with the embodiment is included in at least one embodiment of the present disclosure. Additionally, please note that examples of the phrase "in one embodiment" herein do not necessarily all refer to the same embodiment.

In the description provided herein, numerous specific details are set forth. However, it is understood that embodiments of the present disclosure may be practiced without these specific details. In some instances, well-known methods, structures and techniques have not been shown in detail in order to not obscure the understanding of this description.

Finally, it should be noted that the above embodiments are only used to illustrate the technical solutions of the present disclosure, but not to limit them; although the present disclosure has been described in detail with reference to the above embodiments, those skilled in the art should understand that, the technical solutions described in the above embodiments can still be modified, or some or all of the technical features thereof can be equivalently replaced; and these modifications or replacements do not make the essence of the corresponding technical solutions deviate from the sprits and scope of the technical solutions of the embodiments of the present disclosure.

The invention claimed is:

1. An array substrate, comprising a display area and a non-display area connected to the display area, and the display area comprises a plurality of sub-pixels arranged in an array;

wherein the non-display area comprises at least one polysilicon transistor, each of the sub-pixels comprises an oxide transistor and a pixel electrode;

wherein a gate of the oxide transistor as well as a first electrode and a second electrode of the polysilicon transistor are arranged in a same layer; an active layer of the oxide transistor and the pixel electrode are arranged in a same layer, and are in contact with each other; the active layer of the oxide transistor comprises an oxide semiconductor material, and the pixel electrode comprises an oxide conductor material;

wherein the array substrate further comprises a base, wherein the polysilicon transistor and the sub-pixels are arranged on a same side of the base;

wherein the polysilicon transistor is a top-gate polysilicon transistor, the gate of the oxide transistor is arranged on a side of the active layer of the oxide transistor facing away from the base, and an orthographic projection of the gate of the oxide transistor on the base at least partially overlaps with an orthographic projection of the active layer of the oxide transistor on the base;

wherein the sub-pixel further comprises a light shielding portion, wherein the light shielding portion is disposed on a side of the active layer of the oxide transistor close to the base, and the orthographic projection of the active layer of the oxide transistor on the base is within an orthographic projection of the light shielding portion on the base, and an orthographic projection of the pixel electrode on the base partially overlaps with the orthographic projection of the light shielding portion on the base.

2. The array substrate according to claim 1, wherein the orthographic projection of the gate of the oxide transistor on the base is within the orthographic projection of the active layer of the oxide transistor on the base.

3. The array substrate according to claim 1, further comprising a gate insulation layer disposed between the active layer of the oxide transistor and the gate of the oxide transistor, and the gate insulation layer is an oxygen-enriched oxide layer.

4. The array substrate according to claim 1, wherein the oxide transistor further comprises a connection electrode, wherein the connection electrode is disposed on a side of the gate of the oxide transistor facing away from the base, and is electrically connected to the active layer of the oxide transistor.

5. The array substrate according to claim 1, wherein a gate of the polysilicon transistor and the light shielding portion are arranged in a same layer.

6. The array substrate according to claim 1, wherein the sub-pixel further comprises an opening area and a non-opening area connected to the opening area;
wherein the oxide transistor is disposed in the non-opening area, the pixel electrode comprises a first sub-electrode and a second sub-electrode, and two sides of the first sub-electrode are in contact with the second sub-electrode and the active layer of the oxide transistor respectively, the first sub-electrode is disposed in the non-opening area, and the second sub-electrode is disposed in the opening area.

7. The array substrate according to claim 6, wherein the opening area of the sub-pixel further comprises a first passivation portion and a common electrode;
wherein the first passivation portion covers the second sub-electrode, and the common electrode is disposed on a side of the first passivation portion facing away from the second sub-electrode.

8. The array substrate according to claim 7, wherein the pixel electrode is a planar electrode, and the common electrode comprises at least one strip-shaped sub-electrode.

9. The array substrate according to claim 7, further comprising a second passivation portion, wherein the second passivation portion covers the polysilicon transistor and the oxide transistor.

10. The array substrate according to claim 9, wherein the array substrate further comprises a flat portion, the flat portion is arranged on a side of the second passivation portion close to the base, and an orthographic projection of the flat portion on the base does not overlap with an orthographic projection of the first passivation portion on the base.

11. The array substrate according to claim 1, wherein the display area further comprises a plurality of gate lines and a plurality of data lines disposed on the base;
wherein a part of the gate line that overlaps with the active layer of the oxide transistor along a direction perpendicular to the base is the gate of the oxide transistor; the gate lines as well the first electrode and the second electrode of the polysilicon transistor are arranged in a same layer;
wherein a part of the data line that overlaps with the active layer of the oxide transistor along the direction perpendicular to the base is a connection electrode of the oxide transistor.

12. A display panel, comprising the array substrate, wherein the array substrate comprises a display area and a non-display area connected to the display area, and the display area comprises a plurality of sub-pixels arranged in an array;
wherein the non-display area comprises at least one polysilicon transistor, each of the sub-pixels comprises an oxide transistor and a pixel electrode;
wherein a gate of the oxide transistor as well as a first electrode and a second electrode of the polysilicon transistor are arranged in a same layer; an active layer of the oxide transistor and the pixel electrode are arranged in a same layer, and are in contact with each other; the active layer of the oxide transistor comprises an oxide semiconductor material, and the pixel electrode comprises an oxide conductor material;
wherein the array substrate further comprises a base, wherein the polysilicon transistor and the sub-pixels are arranged on a same side of the base;
wherein the polysilicon transistor is a top-gate polysilicon transistor, the gate of the oxide transistor is arranged on a side of the active layer of the oxide transistor facing away from the base, and an orthographic projection of the gate of the oxide transistor on the base at least partially overlaps with an orthographic projection of the active layer of the oxide transistor on the base;
wherein the sub-pixel further comprises a light shielding portion, wherein the light shielding portion is disposed on a side of the active layer of the oxide transistor close to the base, and the orthographic projection of the active layer of the oxide transistor on the base is within an orthographic projection of the light shielding portion on the base, and an orthographic projection of the pixel electrode on the base partially overlaps with the orthographic projection of the light shielding portion on the base.

13. A method for manufacturing an array substrate, comprising:
forming at least one polysilicon transistor and a plurality of sub-pixels arranged in an array, wherein the polysilicon transistor is disposed in a non-display area of the array substrate, and the sub-pixel is disposed in a display area of the array substrate and comprises an oxide transistor and a pixel electrode;
wherein the forming at least one polysilicon transistor and a plurality of sub-pixels comprises:
forming an active layer of the oxide transistor and the pixel electrode through one patterning process, wherein the active layer of the oxide transistor is in contact with the pixel electrode, the active layer of the oxide transistor comprises an oxide semiconductor material, the pixel electrode comprises an oxide conductor material; and
forming a gate of the oxide transistor as well as a first electrode and a second electrode of the polysilicon transistor through one patterning process;
wherein the array substrate further comprises a base, wherein the polysilicon transistor and the sub-pixels are arranged on a same side of the base;
wherein the polysilicon transistor is a top-gate polysilicon transistor, the gate of the oxide transistor is arranged on a side of the active layer of the oxide transistor facing away from the base, and an orthographic projection of the gate of the oxide transistor on the base at least partially overlaps with an orthographic projection of the active layer of the oxide transistor on the base;

wherein the sub-pixel further comprises a light shielding portion, wherein the light shielding portion is disposed on a side of the active layer of the oxide transistor close to the base, and the orthographic projection of the active layer of the oxide transistor on the base is within an orthographic projection of the light shielding portion on the base, and an orthographic projection of the pixel electrode on the base partially overlaps with the orthographic projection of the light shielding portion on the base.

14. The method according to claim 13, wherein the forming an active layer of the oxide transistor and the pixel electrode through one patterning process comprises:
   forming an oxide semiconductor layer through one patterning process; and
   performing conductive treatment on a portion to be conductive in the oxide semiconductor layer, to form the active layer of the oxide transistor and the pixel electrode.

* * * * *